United States Patent [19]
Shin

[11] Patent Number: 6,076,138
[45] Date of Patent: Jun. 13, 2000

[54] METHOD OF PRE-PROGRAMMING A FLASH MEMORY CELL

[75] Inventor: Kye Wan Shin, Inchon, Rep. of Korea

[73] Assignee: Hyundai Electronics Industries Co., Ltd., Kyungki-Do, Rep. of Korea

[21] Appl. No.: 08/998,952

[22] Filed: Dec. 29, 1997

[30] Foreign Application Priority Data

Dec. 28, 1996 [KR] Rep. of Korea ............... 96-74998

[51] Int. Cl.[7] .................................................. G06F 12/02
[52] U.S. Cl. ..................... 711/103; 365/185.33; 711/218
[58] Field of Search ............................ 711/103, 217, 711/218, 219; 365/185.33

[56] References Cited

U.S. PATENT DOCUMENTS 5,297,095 3/1994 Sato et al. .
5,563,823 10/1996 Yiu et al. ..................... 365/185.16
5,610,861 3/1997 Sim ............................... 365/185.24
5,621,738 4/1997 Caywood et al. ............... 371/21.4

FOREIGN PATENT DOCUMENTS

95/07534 of 1995 WIPO .

*Primary Examiner*—Hiep T. Nguyen
*Attorney, Agent, or Firm*—Scott C. Harris, Esq.

[57] ABSTRACT

(The present invention discloses) a method of pre-programming a flash memory cell. According to the present invention, it makes it possible to execute a continuous programming by performing a pre-programming step of internal algorithms with a bulk program verification step not with a byte or word pre-programming step when an erasure operation of a flash memory cell using a stack gate cell is performed.

2 Claims, 7 Drawing Sheets

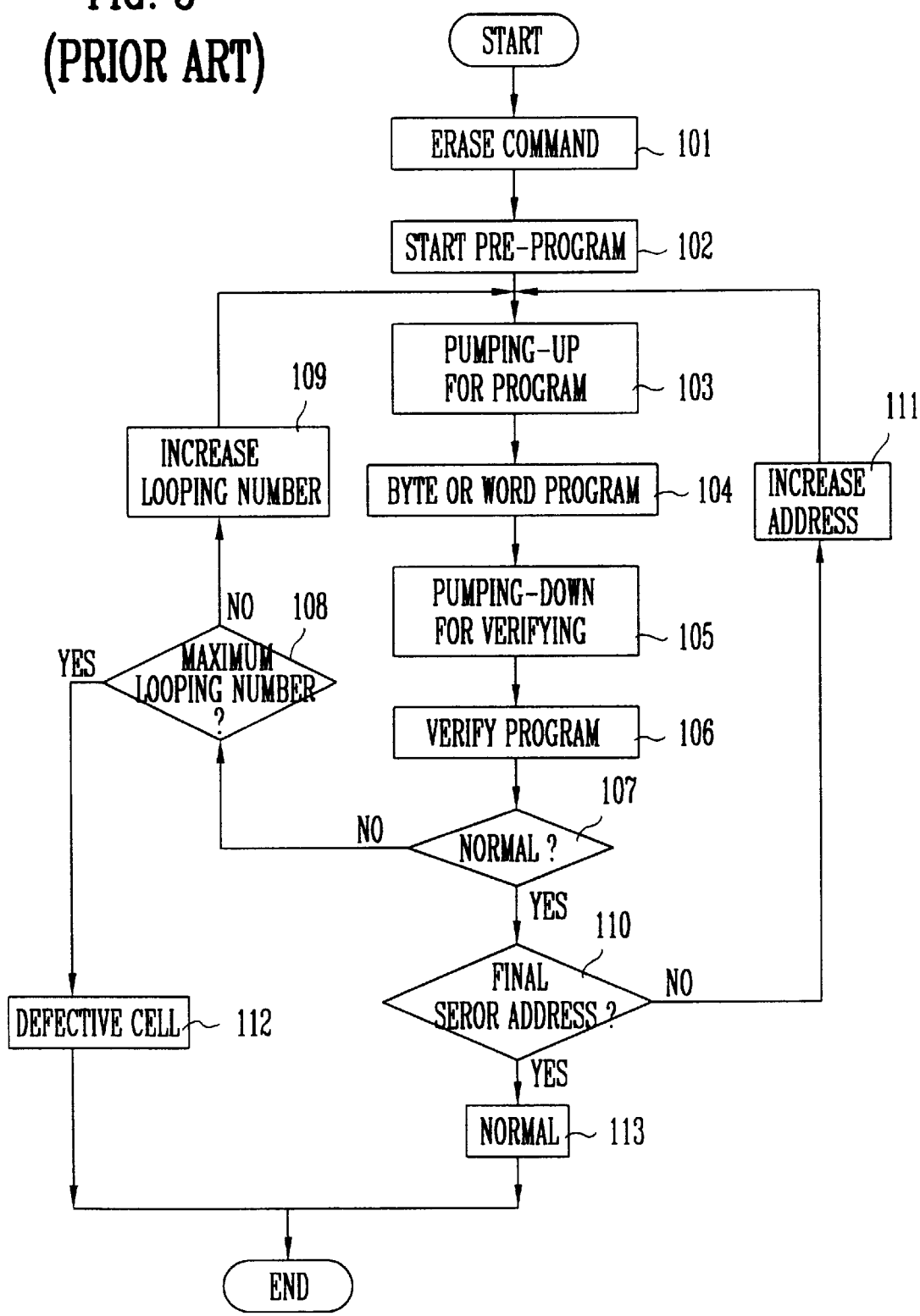

METHOD OF PRE-PROGRAMMING A FLASH MEMORY CELL

BACKGROUND OF THE INVENTION

1. Field of the Invention

The present invention relates to a method of pre-programming a flash memory cell. In particular, the present invention relates to a method of pre-programming a flash memory cell which can execute a continuous program operation and can reduce a pre-programming time by performing a program verification operation using a local clock.

2. Description of the Prior Art

Generally, prior to an erase operation, a pre-program operation is performed repeatedly for all the cells of the sector to be erased by byte or word unit in a normal programming step. In pre-program operation, it can be seen that when a pre-program operation is performed based on a normal program step, the time of the pre-program operation is not so small at the time of erasure operation.

Also, as a semiconductor device becomes more higher integrated, the time taken by pre-program operation is longer than the time taken by erasure operation in an erasure operation.

FIG. 1 is a functional block diagram of a conventional method of pre-programming a flash memory cell.

A general step of programming can be mainly divided into a programming step and a program verifying step when considering internal algorithms. The programming step is consisted of a pumping up step for programming, a real programming step, a pumping down for program verifying. Since data to be programmed are not always selected in the programming step, a program verify operation is performed simultaneously with the program operation at the time of program operation, and then data are provided so that cells can be programmed according to specified addresses, as shown in FIG. 2A and FIG. 2B.

FIG. 3 is a flow chart for explaining a conventional method of pre-programming, the pre-programming procedures will be explained as follows.

At step 102, a pre-program operation is performed in response to an erase command of step 101 for a cell by means of an internal counter. Thereafter, at step 103, a pumping time for programming is lapsed, then at step 104, a byte or a word program operation is executed. At step 105, when pumping-down time for a program verify operation is lapsed, a verify operation is performed at step 106. At step 107, a verify operation is performed for verifying whether the cell is normally programmed or not. If the cell was not normally programmed, a verify operation is performed at step 108 for verifying whether a maximum looping number is same as a maximum programming number preset within the internal counter N of the chip or not. If the looping number is not same as the maximum programming number, the number of program operation is increased at step 109, and then returns to step 103 in order to repeatedly perform a program operation.

However, at step 108, if the looping number is same as the maximum programming number preset within the internal counter N of the chip, it is determined whether the cell is defective or not at step 112, and then a program operation stops. Also, at step 107, if the cell is in a normally programmed state, an address of final sector is verified at step 110. At step 110, if it was not an address of the final sector, the number of the sector address preset within the internal counter of the chip is increased at step 111, and then returns to step 103 in order to repeatedly perform a program operation. Meanwhile, if it was an address of a final sector at step 110, it is determined whether the cell is normal or not at step 110, and then a program operation is finished.

In a conventional method of pre-programming as described above, since all the cells of a sectors are pre-programmed repeatedly by a byte or word unit at a normal programming step, the entire programming time of a chip is delayed.

SUMMARY OF THE INVENTION

It is an object of the present invention to provide a method of pre-programming a flash memory cell which can perform a bulk program verify step in order to program all cells to a data '0'.

To achieve this object, a method of pre-programming a flash memory cell comprises the step of sequentially performing a pre-program to a plurality of cells and sequentially verifying whether a plurality of cells connected to said word lines, respectively, are programmed normally a word line by a word line.

The step of performing a pre-program comprises the step of charge pumping up for supplying a program voltage, programming the plurality of cells and charge pumping down.

Another method of pre-programming a flash memory cell comprises the steps of performing a pre-programming according to a cell erase operation command and then performing a programming by a byte or a word unit through a bulk after a pumping time for program is elapsed; verifying a final sector address when the cell is normal as a result of verify operation of a defective cell; increasing an address and then repeatedly performing program operation when it is not a final sector address as a result of said verify operation; verifying whether said cell is normal or not using a local clock after a pumping-down time for verification is elapsed if the cell is neither normal as a result of said verification operation on the defective cell nor if it is a final sector address as a result of said verification operation; storing an address of defective cell and verifying a maximum looping number preset within an internal counter of chip if the cell is defective as a result of said verify operation; resetting the stored address of the defective cell and then verifying whether it is a final sector address or not when the cell is normal as a result of said verification operation; increasing a looping number and then repeatedly performing a program operation when it is not a maximum looping number preset within the internal counter of the chip as a result of said verification operation; notifying that the cell is defective cell and then finishing the operation when it is a maximum looping number preset within the internal counter of the chip as a result of said verify operation; increasing the address and then repeatedly performing a verify operation using the local clock if when it is not a final sector address as a result of said verify operation; and notifying that the cell is normal cell and then finishing the operation when it is a final sector address as a result of said verification operation.

BRIEF DESCRIPTION OF THE DRAWINGS

The above object, and other features and advantages of the present invention will become more apparent by describing the preferred embodiment thereof with reference to the accompanying drawings, in which:

FIG. 3 is a flowchart for explaining a conventional pre-programming method.

DETAILED DESCRIPTION OF THE INVENTION

Figure 1:
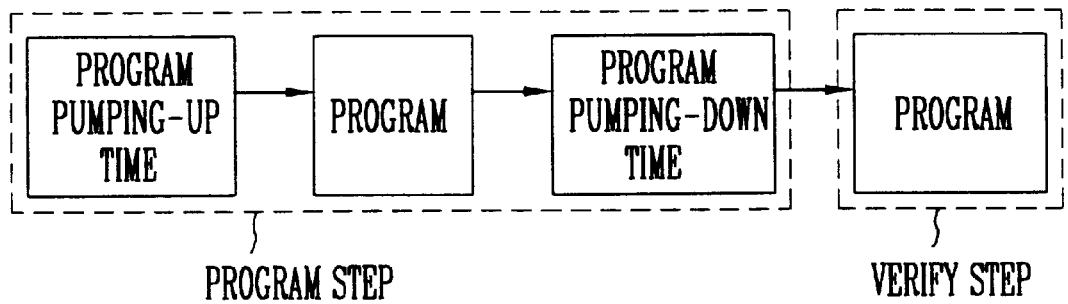
FIG. 1 is a block diagram for explaining a conventional pre-programming method.
Figure 2B:
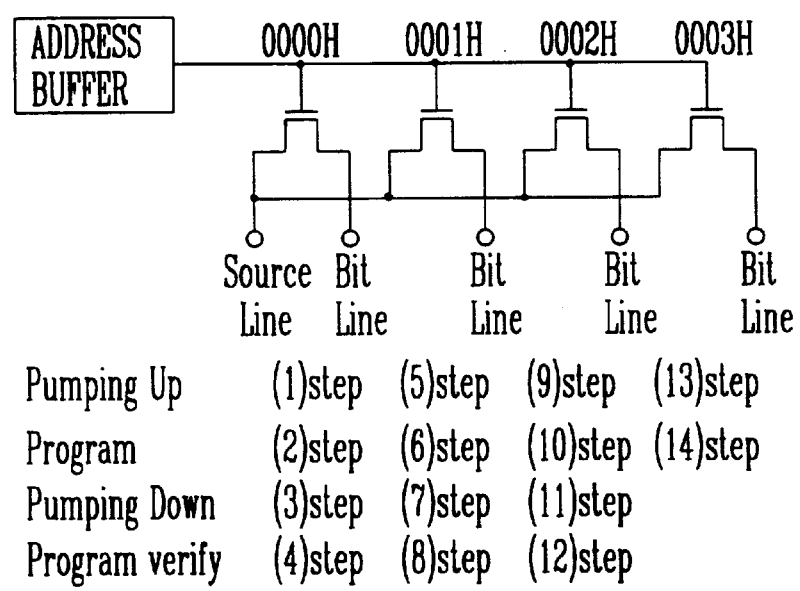
FIGS. 2A and 2B are block diagrams for explaining a conventional pre-programming method.
Figure 2A:
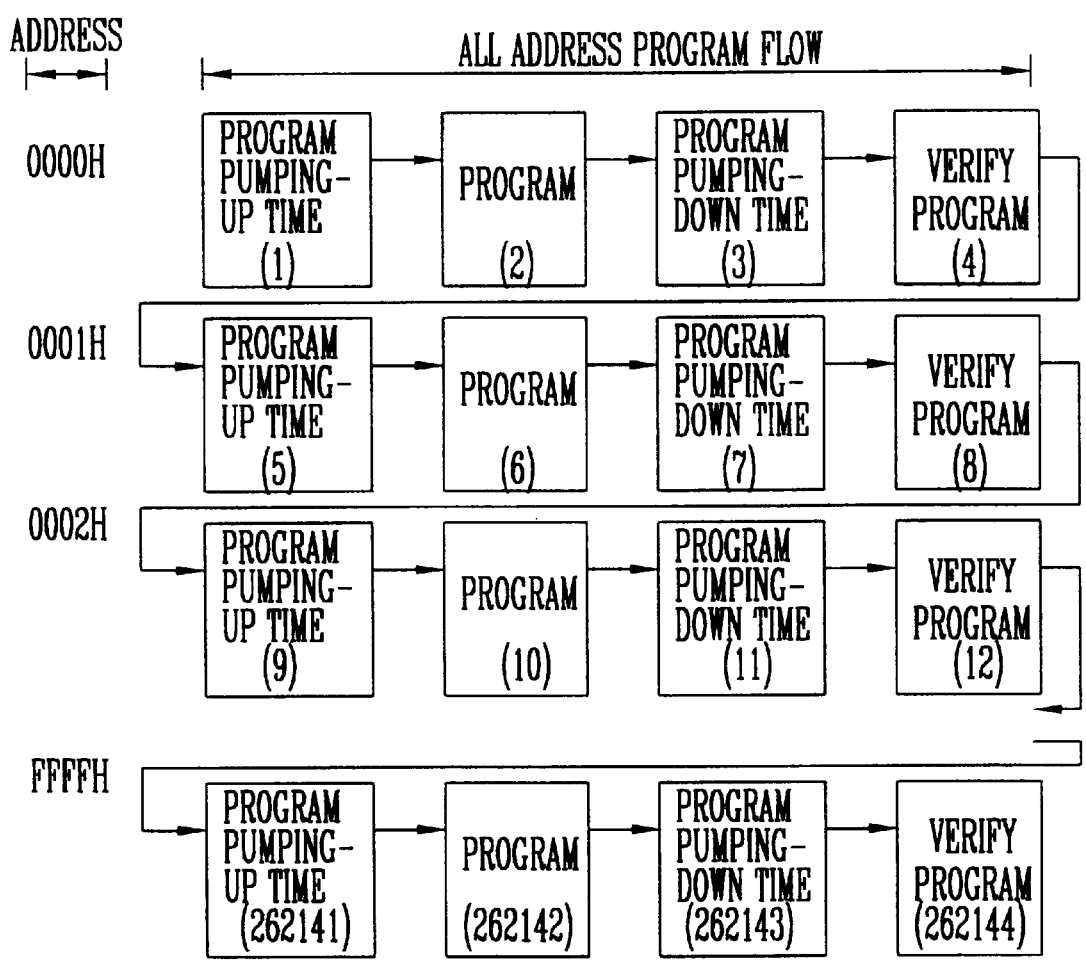
Figure 4A:
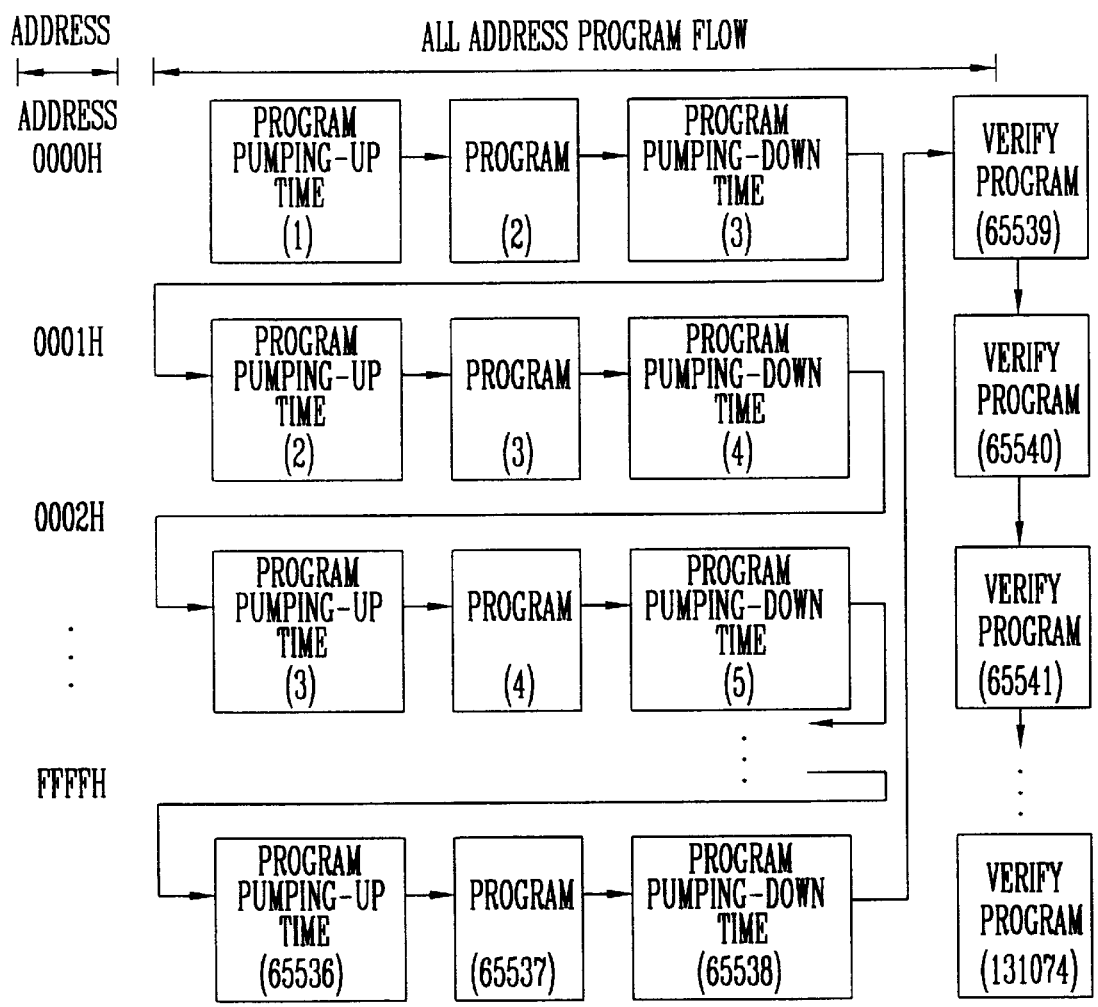
FIGS. 4A and 4B are block diagrams for explaining a pre-programming method according to the present invention.
Figure 4B:
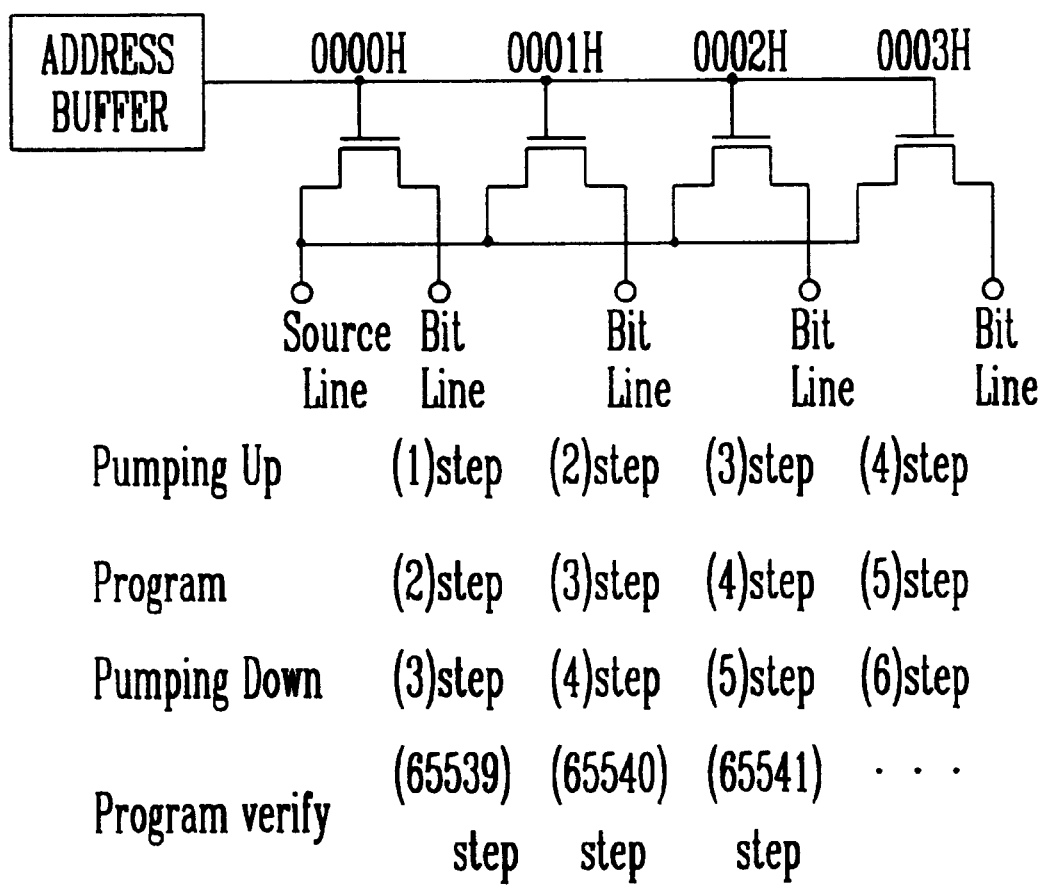

Other objects and advantages of the present invention will be understood by reading the detailed explanation of the embodiment with reference to the accompanying drawings in which:

FIGS. 4A and 4B are block diagrams for explaining a pre-programming method according to the present invention.

In a method of pre-programming the all cells into data '0', data is already selected, a repeated operation for programming and a program verifying with a byte or word unit is not required, a program operation and a program verify operation are performed separately to the all cells. And then, a bulk program verify operation is performed. That is, at the time of program operation, program-up is performed without performing program-up/down. Since bit lines in which a program operation is performed have a word line in common and are charged lines during the program operation, consecutive program is possible. Therefore, the pumping-up time for program and the pumping-down time for verify operation after a program operation can be reduced.

Also, though channel current of a cell flowing upon programming acts as a major factor preventing from being gone into a bulk program, the pre-programming time can be even shorted if the range of program cell is decided, for example 4 byte or 2 word etc. within a peak current at which a chip operates rather than a byte or a word program when a continuous programming is performed. And, by performing a bulk verification operation, when a local clock (a local clock for verifying is a time of feedback to an address buffer, cell, sense amplifier, control logic and address buffer, the local clock indicates a time of pure verify operation in a program or erase operation) is used, the time of a conventional verify operation for all the cells can be shorten.

Accordingly, a pre-program for performing a verify operation by a bulk unit can reduce a pre-programming time due to the local clock for verification, a program-up/down time can be reduced by means of a continuous program operation, thereby reducing a time of chip erase operation.

Figure 5:
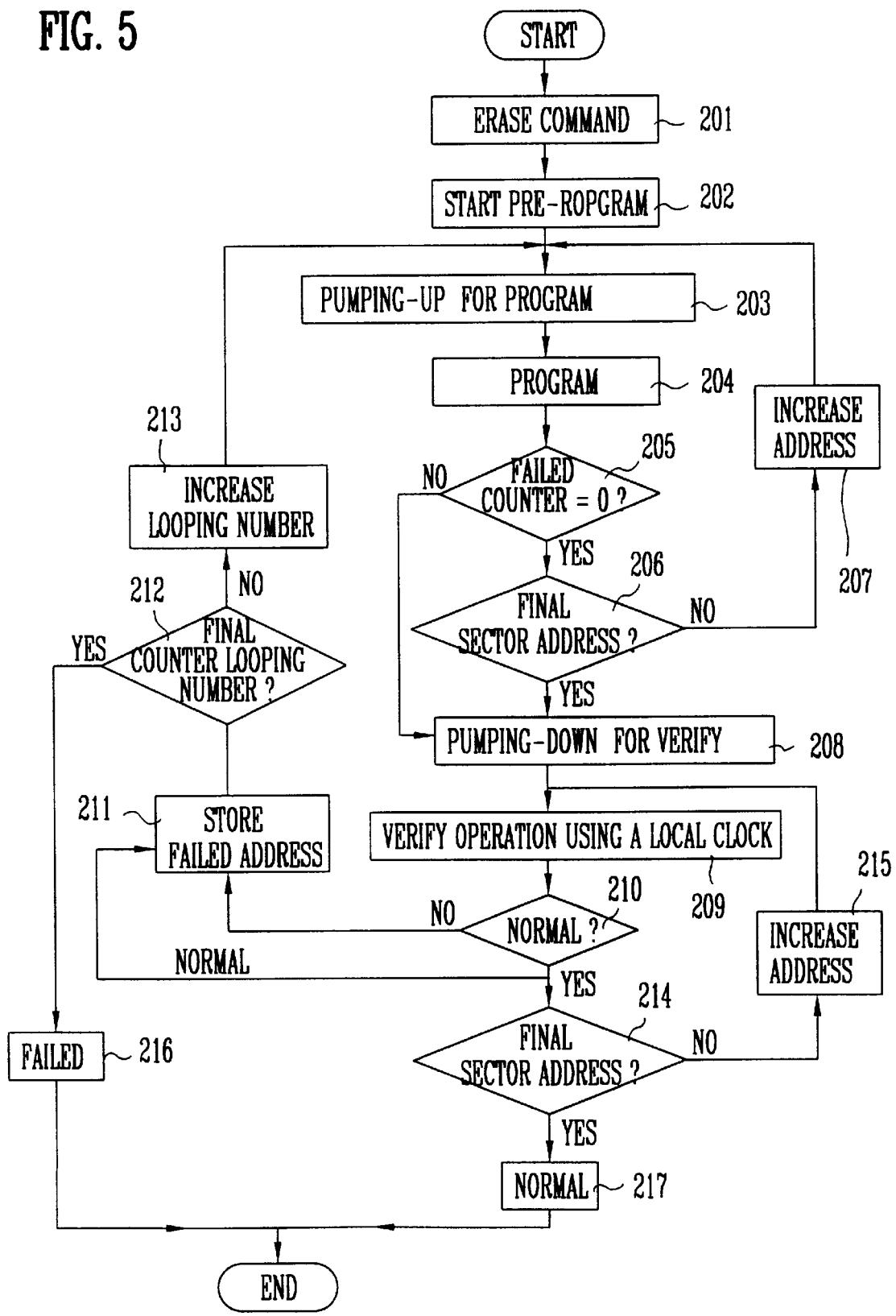
FIG. 5 is a flow chart for explaining a pre-programming method according to the present invention.

FIG. 5 is a flow chart for explaining a pre-programming method according to the present invention.

Beginning at a start signal, a pre-program is begun in response to an erase operation command (201) by means of an internal counter (step 202). After a pumping time for program is lapsed (step 203), a byte or a word programming is executed (step 204). A verify operation to defective counters is performed (step 205), if there is no defective counters, a final sector address is verified (step 206). Also, if it was not a final sector address, an address is increased by one (step 207), and then feedback to step 204 so that a program operation is performed repeatedly. However, if it was a final address (step 206), a pumping-down time for verification is lapsed (step 208). Meanwhile, if it is verified a defective counter at step 205, a pumping-down time for verification is lapsed (step 208). A verify operation is performed using a local clock (step 209), and verify operation is perforemed to determine whether the cell is normal (step 210). If a result of the verification is defective, the address for the defective cell is stored (step 211). A maximum looping number preset within the internal counter of the chip is verified (step 212), if the maximum programming looping number is not same as the maximun looping munber, the looping number is increased by one (1) (step 213) and then feedbacks so that the program operation is repeatedly performed (step 203). However, if it is same as the maximum programming looping number preset within the internal counter of the chip (step 212), it is determined that cell is defective (step 216) and then finishes the program operation. Also, if the cell becomes a normal program state at step 210, a counter in which an address for a defective cell is stored is reset (step 211) and then it is verified whether it is an address of a final sector (step 214). If it is not an address of a final sector (step 214), another sector address preset within an internal counter of the chip is increased by one (1) (step 215), and a verify operation is repeatedly performed using the local clock (step 209). Also, if it is determined that it is a final sector address (step 214), it is determined that the cell is a normal one and a program operation is finished.

Figure 6:
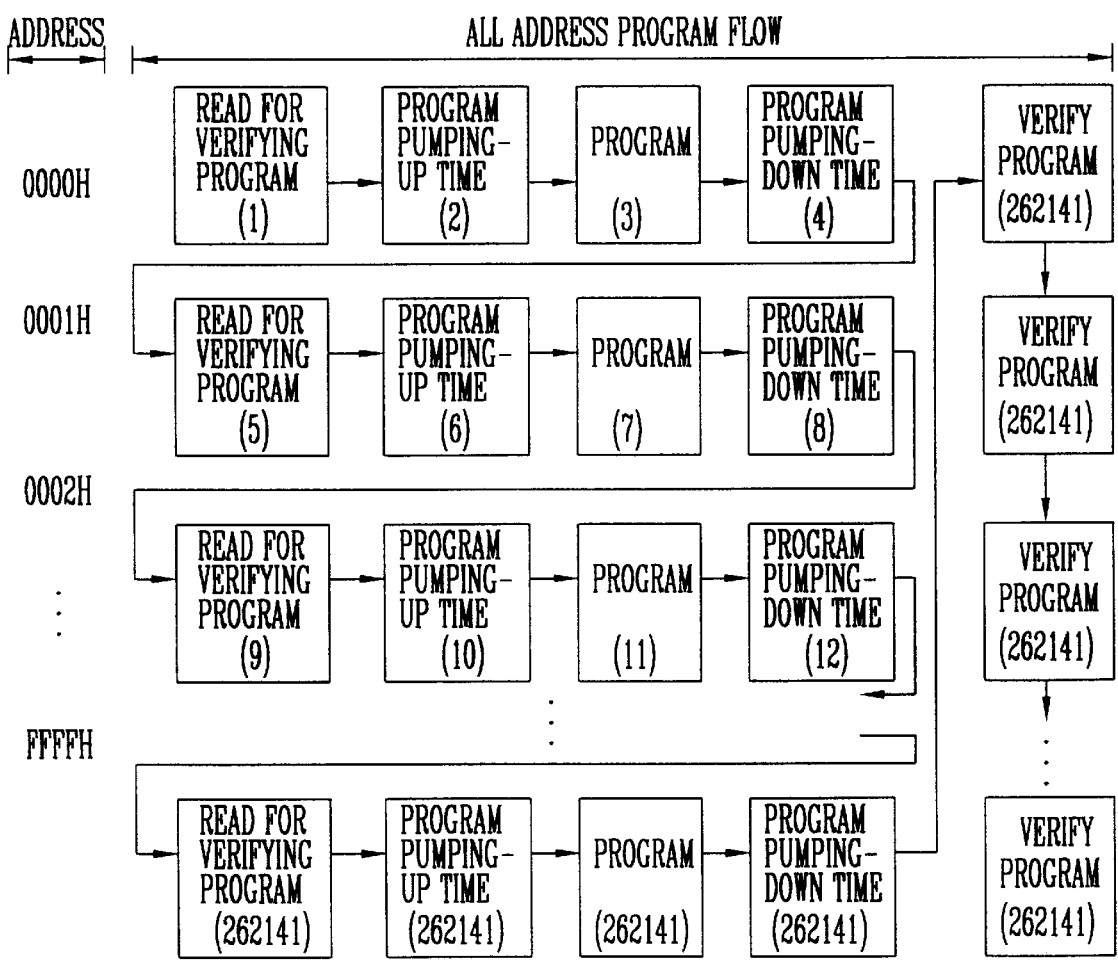
FIG. 6 is a block diagram for explaining a method of verifying a pre-programming according to the present invention.

For example, considering an over-programming, though a pre-program operation for program only the cells erased by performing a read operation against the data for which a program operation is required repeatedly performs a read-verify operation and a program operation as shown in FIG. 6, the time of a pre-program operation in the final program verify operation can be shortened by means of a bulk verify operation using a local clock.

As described above, assuming that one (1) sector is 512K bits and the rate of a byte program is 16 $\mu$ sec, the programming time of one (1) sector of a stack gate cell is as follows:

1. As 512K=$2^{19}$=$2^{16}$*K byte, the programming time of a conventional programming method is $2^{16}$*16 $\mu$ sec=1048 sec.

2. Assuming the total time adding an actual programming time and a pro-programming time using a local clock is 10 $\mu$ sec, as the programming time according to the present invention is $2^{16}$*10 $\mu$ sec=655 sec, the present invention can reduce a time more than 40% of the consumption time consumpted when a conventional method of programming is used.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of pre-programming for a flash memory device comprising the steps of:

sequentially programming all cells of said flash memory device in a word line by word line basis, said programming step of a word line comprising the step of charge pumping up for supplying a program voltage, programming all cells of the word line and charge pumping down;

sequentially verifying whether all cells of said flash memory device are programmed normally in a word line by word line basics.

2. The method of pre-programming a flash memory cell, comprising the steps of:

performing a pre-programming according to a cell erase operation command and then performing a programming in a byte or a word unit through a bulk after a pumping time for program is elapsed;

verifying a final sector address when the cell is normal as a result of verify operation of a defective cell;

increasing an address and then repeatedly performing program operation when it is not a final sector address as a result of said verify operation;

verifying whether said cell is normal or not using a local clock after a pumping-down time for verification is elapsed if the cell is neither normal as a result of said verification operation on the defective cell nor if it is a final sector address as a result of said verification operation;

storing an address of a defective cell and verifying a maximum looping number preset within an internal counter of a chip if the cell is defective as a result of said verifying operation;

resetting the stored address of the defective cell and then verifying whether it is a final sector address or not when the cell is normal as a result of said verification operation;

increasing a looping number and then repeatedly performing a program operation when it is not a maximum looping number preset within the internal counter of the chip as a result of said verification operation;

notifying that the cell is a defective cell and then finishing the operation when it is a maximum looping number preset within the internal counter of the chip as a result of said verify operation;

increasing the address and then repeatedly performing a verify operation using the local clock when it is not a final sector address as a result of said verify operation; and notifying that the cell is normal cell and then finishing the operation when it is a final sector address as a result of said verification operation.

* * * * *